United States Patent [19]

Farrugia

[11] Patent Number: 4,559,497

[45] Date of Patent: Dec. 17, 1985

[54] RANGED VOLTAGE MONITOR WITH OUT-OF-RANGE ENUNCIATORS

[76] Inventor: Anthony Farrugia, 5034 Edenview Dr., San Jose, Calif. 95111

[21] Appl. No.: 394,902

[22] Filed: Jul. 6, 1982

[51] Int. Cl.$^4$ ................. G01R 19/14; G08B 21/00
[52] U.S. Cl. ................................. 324/133; 324/96; 324/115; 340/661
[58] Field of Search .............. 324/96, 122, 115, 133; 340/661, 662, 663

[56] References Cited

U.S. PATENT DOCUMENTS 4,004,220 1/1977 Kerber et al. .................... 324/96
4,006,412 2/1977 Campbell et al. .

Primary Examiner—Ernest F. Karlsen
Attorney, Agent, or Firm—Paul L. Hickman

[57] ABSTRACT

A ranged precision voltage monitor with out-of-range enunciator characterized by a power supply and reference voltage stage, a voltage sensing stage, and an enunciator stage. The power supply stage provides power for the monitor, and further provides a reference voltage and a sensing voltage. The voltage sensing stage senses and displays voltage levels within a predetermined range, and further senses and displays over-range and under-range conditions. The enunciator produces a first audible tone for under-range conditions, and a second audible tone for over-range conditions.

11 Claims, 1 Drawing Figure

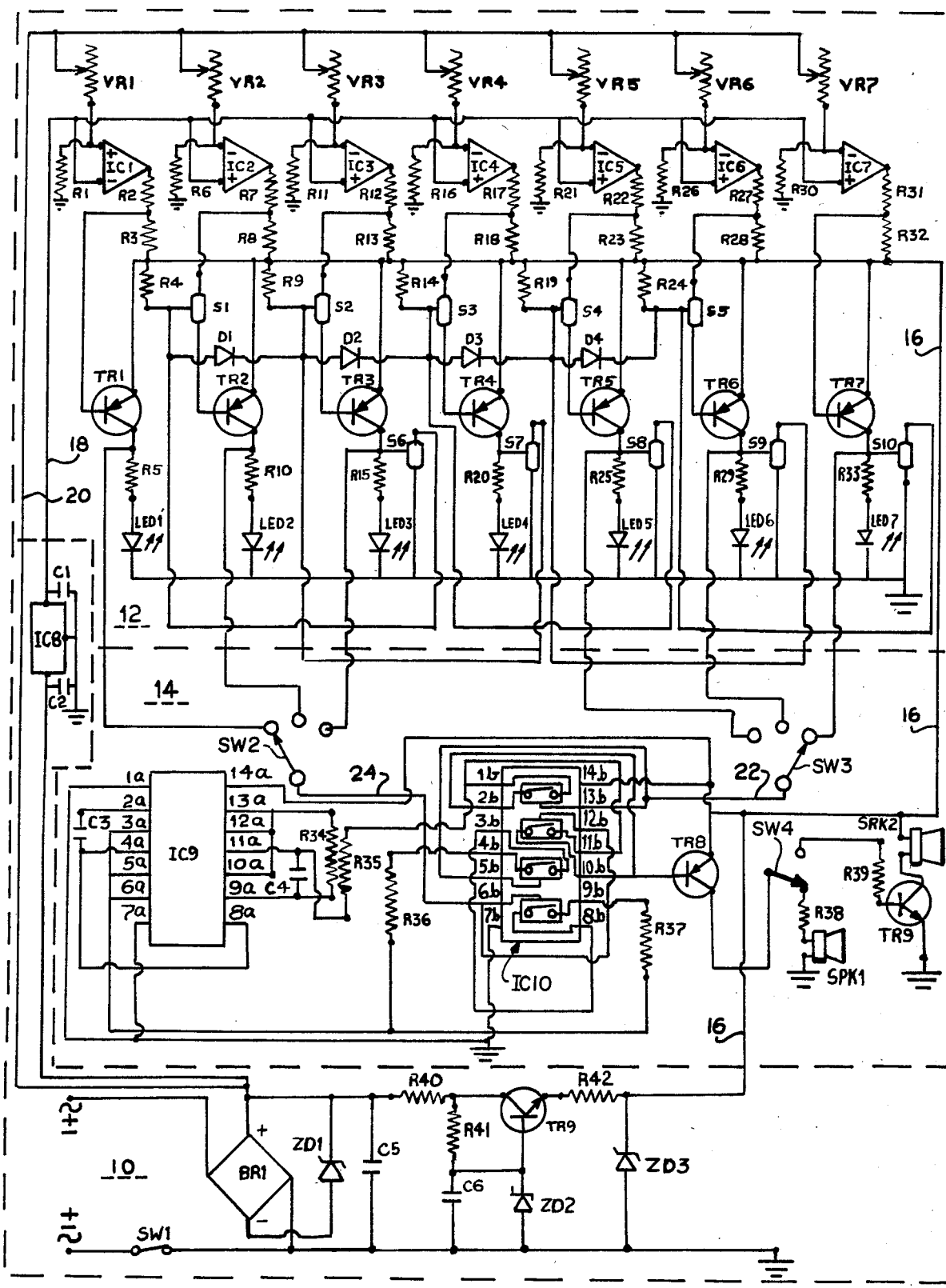

RANGED VOLTAGE MONITOR WITH OUT-OF-RANGE ENUNCIATORS

BACKGROUND OF THE INVENTION

1. Field of the Invention

This invention relates generally to electronic test and monitoring equipment and more particularly to voltage level monitoring equipment.

2. Description of the Prior Art

Battery level indicators are well known in the prior art. For example, in U.S. Pat. No. 4,020,414 of Paredes, a battery-status indicator includes a plurality of comparators having one of their inputs coupled to a reference voltage through a zener diode 56 and having their other input coupled to a battery through a resistive scaling network. The outputs of three of the comparators are coupled to light bulbs 74-78 through driving transistors 80-84, and the output of the fourth comparators is coupled to an alarm 86 by a driving transistor 88. The lights 74-78 will light in sequence as the voltage level drops until the alarm 86 finally sounds.

A problem with battery voltage indicators such as those taught by Paredes is that they drain a substantial amount of current from the battery when two or more of the indicating lights are lit. Furthermore, the display is confusing since a plurality of indicator lights can be illuminated at one time.

A disadvantage with most battery voltage indicators is that they are either of the under-voltage or the over-voltage type. For example, Peredes is an under-voltage type indicator which does not detect or display a warning when dangerous over voltage conditions occur. What the prior art fails to disclose, then, is a ranged voltage monitor which sounds an alarm when the voltage either falls below the predetermined level or rises above a predetermined level, and which accurately and efficiently displays the voltage level within the range.

SUMMARY OF THE INVENTION

An object of this invention is to provide a ranged voltage monitor which sounds an alarm whenever the voltage being sensed drops below a predetermined minimum level or rises above a predetermined maximum level.

Another object of this invention is to provide a ranged voltage monitor as described above which further accurately and efficiently indicates the voltage level within the range.

A still further object of this invention is to provide a ranged voltage monitor which can monitor either AC or DC voltage levels.

Yet another object of this invention is to provide a ranged voltage monitor having a plurality of indicator lights and special circuitry to insure that only one indicator light can remain illuminated at a time.

Another object of this invention is to provide a ranged voltage monitor which signals dangerous under-voltage or overvoltage conditions with audibly differentiable signals.

Briefly, the invention includes a first operational amplifier for sensing under-range voltages, another operational amplifier for sensing over-range voltages, and a number of mid-range operational amplifiers for sensing mid-range voltage levels. The outputs of each of the operational amplifiers is coupled to a light emitting diode by way of a transistor driving circuit. Associated with each of the mid-range driving transistors is an electronic switch controlled by the operational amplifier of the succeeding stage. Thus, the output of each mid-range stage can be disabled by the output of any stages above it.

The monitor of the present invention also includes a AC/DC rectification and filtering stage which provides power, a stable reference voltage, and a suitable sensing voltage for the operational amplifiers. A dual pitch audio alarm coupled to the operational amplifiers by user selectable switches provides audible alarms when the voltage is not within a predetermined range. Tones of differing durations are produced depending upon whether the sensed voltage drops below a first predetermined level or rises above a second predetermined level.

An advantage of this invention is that it senses both under voltage and over voltage conditions.

Another advantage of this invention is that it senses and displays a number of mid-range voltage levels.

A further advantage of this invention is that the range of the audible alarm is user selectable.

Another advantage of this invention is that only one display light is illuminated at a time to minimize the current drain of the device, and to more clearly indicate the status of the voltage being sensed.

Yet another advantage of this invention is that it can be used to sense either AC or DC voltages and thus has many diverse applications.

Another advantage of this invention is that the rectification and filtering stage shields the unit from many abuses including spikes, static voltages, incorrect voltage polarities, and 100% overloads lasting for an indefinte period of time.

A still further advantage of this invention is that it has a dual level enunciator which produces one tone in under-voltage conditions and produces another tone in over-voltage conditions. This enables an operator to monitor the vital voltage levels of a circuit without having to keep a constant eye on the device.

These and other objects and advantages of the present invention will no doubt become apparent upon a reading of the following descriptions and a study of the several figures of the drawing.

BRIEF DESCRIPTION OF THE DRAWING

FIG. 1 is a schematic diagram of a ranged voltage monitor with out-of-range enunciator in accordance with the present invention.

DETAILED DESCRIPTION OF THE PREFERRED EMBODIMENT(S)

Referring to FIG. 1, a ranged voltage monitor in accordance with the preset invention includes a power supply and regulation stage 10, a voltage monitoring stage 12, and a dual-tone audio enunciator stage 14. The power and regulation stage 10 produces power for the circuit and provides both a sensing voltage and a reference voltage for the voltage monitoring stage. The voltage monitoring stage detects both under voltage and over voltage conditions, and will display the voltage levels within the range. Enunciator 14 will produce an audible under-range warning signal if the sensed voltage falls below a predetermined level, and will produce a different, audible over-range warning signal if the voltage rises over a predetermined level. As will be discussed subsequently, both the under-range level and the over-range level are user selectable.

The input to power supply 10 is polarity independent and can accept AC or DC power sources as indicated. The power supply is manually switched on/off with SPST switch SW1. When used with an automotive power system, the input is typically 9-16 VDC.

After rectification by the full wave bridge BR1, the voltage is fed to R40. Zener ZD1 (which typically has a break down voltage 75% over the maximum applied voltage) and capacitor C5 suppress harmful spikes which would otherwise damage the integrated circuits and transistors. The voltage dropped across R40 is biased by resistor R41 and smoothed by capacitor C6. Capacitor C6 also smooths the gain of transistor TR9.

Zener ZD2 sets the output voltage at the emitter of transistor TR9 and thus determines the voltage of the first stage of the power supply. Resistor R42 and Zener ZD3 comprise a second stage voltage regulator and are used to maintain a stable six volt level on a power line 16, and to insure a constant and precise voltage level over a wide range of input voltages.

A five volt regulator IC8 is coupled to the positive output of BR1 to provide a five volt reference on a line 18. Capacitors C1 and C2 are associated with the regulator. A sensing voltage line 20 is coupled to the output of bridge BR1.

The voltage monitoring stage 12 includes seven operational amplifiers IC1-IC7. Each of the IC's have an inverting input indicated by a minus sign and a non-inverting input indicated by a plus sign. The non-inverting input of IC1 is coupled to sensing voltage line 20 by a variable resistor VR1. The inverting inputs of IC2-IC7 are coupled to sensing voltage line 20 by and variable resistors VR2-VR7. The inverting inputs of IC2-IC7 are coupled to ground through resistors R6, R11, R16, R21, R26, and R30, respectively. The output of IC1 and the outputs of IC2-IC7 are coupled to power line 16 by resistive dividing circuits including resistors R2, R3, R7, R8, R12, R13, R17, R18, R22, R23, R27, R28, R31, and R32. Reference voltage is supplied by the output of IC8 via reference voltage line 18 to the inverting inputs of IC1 and the non-inverting inputs of IC2-IC7.

Associated with operational amplifiers IC1-IC7 are seven driving transistors TR1-TR7. The emitters of TR2-TR7 are coupled to power line 16, and the collectors of transistors TR1-TR7 are coupled to ground by the series connection of current limiting resistors R5, R10, R15, R20, R25, R29, R33 and light emitting diodes LED1-LED7.

A number of electronic switches S1-S10 are associated with driving transistors TR2-TR7. Each of the electronic switches has three leads, one of which is control lead and the other two of which are input/output leads. When the signal level on the control lead is positive with respect to ground, the remaining pair of leads are shorted together electronically. When the voltage level on the control lead is at or below ground, the connection between the remaining pair of leads is electronically opened.

Switches S1-S5 coupled the bases of transistors TR2-TR6 to the outputs of IC2-IC6. Switches S6-S10 couple the control leads of switches S1-S5 to ground. The control leads of S1-S5 are also coupled to the outputs of IC2-IC7 by resistive networks including resistors R2, R3, R7, R8, R12, R13, R17, R18, R22, R23, R27, R28, R31 and R32. Resistors R4, R9, R14, R19 and R24 insure that the control pins of S1-S5 are positively biased. The control leads of switches S6-S10 are coupled to the collectors of TR3-TR7.

Voltage monitoring stage 12 also includes four diodes D1-D4. D1 couples the control leads of switches S1 and S2 together, D2 couples the control leads of switches S2 and S3 together, diode D3 couples the control leads of S3 and S4 together, and diode D4 couples the control leads of S4 and S5 together. The purpose of diodes D1-D4 is to insure that when a control of one of switches S2-S5 is grounded by one of switches S6-S10, then the central or control pins for all lower switches S2-S5 are also grounded.

Enunciator stage 14 has a first control input 22 selected by SP3T switch SW3, a second control input 24 selected by SP3T switch SW2, a tone generator IC9 such as a CD4001, and a switch network IC10. The frequency and duration of the output signal of tone generator IC9 are determined by resistors R34, R36 and R37 and capacitors C3 and C4. In this preferred embodiment, the frequency produced by tone generator IC9 is fixed, and the duration is selectable by resistors R36 and R37.

When a high signal is present on input line 24 pins 6b and 12b of the switch network are enabled coupling pin 8b to pin 9b and coupling pin 10b to pin 11b. The shorting of pins 8b and 9b connects R37 to C4 to produce a series of high frequency tones of long duration. The shorting of pins 10b and 11b biases TR8 with the output of the tone generator IC9 via resistor R35.

When a high signal is present on input line 22 control pins 5b and 13b of the switching network are enabled to short pins 3b and 4b together and to short pins 1b and 2b together. The shorting of pins 3b and 4b causes resistor R36 to be coupled to capacitor C4 to produce a series of high frequency tones of short duration. The shorting of pins 1b and 2b biases TR8 with the output of tone generator IC9 via resistor R35.

Of course, other audibly distinguishable signals can be produced with a tone generator and switching circuit. It is therefore intended that the present design of the enunciator be considered as one preferred example of a two output enunciator.

The base of TR8 is coupled to a mechanical SPDT switch SW4. One of the throws of switch SW4 is coupled to ground through the series connection of the resistor R38 and speaker SP1, and the other throw of SW4 is coupled to the base of transistor TR9 by a resistor R39. The emitter of transistor TR9 is grounded and the collector is available to power an external, high power speaker SP2. Of course, SP1 or SP2 could be replaced by other responsive devices such as relays, SCR's etc. which could drive external devices. Furthermore, relays, SCR's and similar devices can be coupled to the common pin of SW2 and/or SW3 to control external devices.

In operation, a power source such as an automobile or aircraft battery is connected to the input of the power supply and regulation stage 10. As mentioned earlier, the power source can be coupled to the input without regard for polarity since the power supply stage 10 is polarity independent. If an AC power source is connected to the input the rectification provided by bridge BR1 will allow the RMS value of the AC source to be monitored.

The threshold levels for IC1-IC7 are set by variable resistors VR1-VR7, respectively. For example, VR1 might be set such that a threshold level for IC1 is 11 volts, and VR7 might be adjusted so that the threshold level for IC7 is 15.5 volts. The threshold levels for IC2–IC6 can then be adjusted to be within the range of 11 to 15.5 volts.

As a hypothetical example, assume that the variable resistors are adjusted such that the threshold level of IC1 is 10 volts, IC2 at 10 volts, IC3 at 11 volts, IC4 at 12 volts, IC5 at 14 volts, IC6 at 15 volts, and IC7 at 15.5 volts and assume that the voltage on line 20 is initially at 15 volts. This would develop an over voltage sensing signal at the output of IC6 which would forward bias transistor TR6, allowing it to conduct. LED 6 would then illuminate with the current it drew through resistor R29. Switch S4 would be on since the control lead of switch S5 would be floating near ground due to the shut-off condition of transistor TR7. The current flowing through transistor TR6 causes a positive voltage to be developed at its collector which turns on switch S9. Switch S9 will ground the control lead of switch S4 and, through diodes D3, D2, and D1, the control leads of switches S3, S2, and S1. Thus, transistors TR1–TR5 and TR7 are all biased to shut-off and only LED 6 is illuminated.

If the voltage on line 20 rises to 15.5 volts or above, and switch SW3 is in the position illustrated in the FIGURE, then IC7 will produce an over-voltage signal at its output, turning on transistor TR7 and lighting LED 7. The positive voltage developed at the collector of TR7 will switch on switch S10, shutting off switches S1–S5 and thus turning off all of the LEDs except for LED7. The voltage at the collector TR7 will also develop an over-range signal on line 22 to produce a tone signal at the base of TR8 (assuming, of course, that switch S1 is in the position shown). As explained previously, this will develop an audible alarm on either speaker SP1 or an external speaker coupled to transistor TR8. Of course, SPK1 or SPK2 could be replaced by a relay or an SCR to drive other types of alarms or systems.

When the voltage drops to 14 volts transistor TR6 and TR7 will turn off and transistor TR5 will turn on illuminating LED5. The voltage developed at the collector of TR5 will turn on switch S8 which, in turn, will shut off switches S1–S3. When the voltage drops to 12 volts, transistor TR5 will shut off and transistor TR4 will turn on to illuminate LED4 and to turn on switch S7 and turn off switch S1 and S2. When the voltage drops to 11 volts transistor TR3 will turn on to illuminate LED3 and to turn on switch S6 which turns off switch S1. When the voltage drops to 10 volts TR3–TR7 will be turned off and TR2 will turn on illuminating LED2.

When the input to IC1 drops below 10 volts transistor TR1 will turn on illuminating LED1 and turning off transistors TR2–TR7. Assuming that SW2 is in the position shown in the FIGURE, an under-range signal will be developed on line 24.

To summarize, a power source is coupled to the input of stage 10 device which develops a reference voltage output, a sensing voltage output, and a power voltage output. An operational amplifier IC1 serves as a under-range sensing means to determine when the voltage falls below the voltage range to be monitored. When the voltage on voltage sensing line 20 does fall below the range, LED1 will light and a first distinctive audible alarm will be produced on speaker SP1. If the voltage on voltage sensing line 20 is higher than the range of voltages to be monitored by this device LED7 will illuminate and a second distinctive audible tone will be developed on speaker SP1. If the voltage is within the range determined by the threshold level of IC1 and a threshold level of IC7, one of LED's LED2–LED6 will illuminate. There is no audible alarm when the voltages are within the monitoring range, unless switches SW2 and SW3 are set to sound within the range.

It will be noted that due to electronic switches S1–S10 and diodes D1–D4 that each of transistors TR4–TR7 will shut off any lower transistor in the stage. This insures that only one of LED1–LED7 will be illuminated at a time.

While this invention has been described in terms of a few preferred embodiments, it is contemplated that persons reading the preceding descriptions and studying the drawing will realize various alterations, permutations and modifications thereof. For example, switches S1–S10 could be replaced by similarly functioning components such as analog switches, transistors, triacs, SCR's, or even relays. Also, with a suitable substitution of components, the present invention can be used to monitor AC or DC voltages in any conceivable voltage range.

It is therefore intended that the following appended claims be interpreted as including all such alterations, permutations and modifications as fall within the true spirit and scope of the present invention.

What is claimed is:

1. A ranged voltage monitor comprising:
   (a) under-range sensing means having a reference input, a sensing input, and an output, said under-range sensing means being operative to develop an under-range signal at said output when the voltage level at said sending input drops below a first predetermined level;
   (b) over-range sensing means having a reference input, a sensing input, and an output, said over-range sensing means being operative to develop an over-range signal at said output when the voltage level at said sensing input rises above a second predetermined level;
   (c) at least one mid-range sensing stage having a reference input and at least one sensing input, said at least one mid-range sensing stage being operative to develop at least one mid-range voltage level signal;
   (d) a plurality of visual indicators and means for connecting at least one of said indicators to each of said under-range sensing means, said over range sensing means, and said mid-range sensing stage;
   (e) a dual-level audible enunciator having inputs coupled to signals produced by the outputs of said under-range sensing means and said over-range sensing means; and
   (f) disabling means coupled to said indicators for disabling all but one indicator associated with the highest sensed voltage level.

2. A ranged voltage monitor as recited in claim 1 wherein said mid-range stage includes a plurality of mid-range sensing means each operative to develop an over-voltage signal when the voltage level at their inputs rises above a predetermined level, said mid-range sensing means being cascaded so that each succeeding mid-range sensing means in the stage triggers at a higher predetermined voltage level than the one preceding it, wherein an indicator is associated with each on of the mid-range sensing means.

3. A ranged voltage monitor as recited in claim 2 further comprising power supply and regulation means having a polarity independent input coupled to a power source to be monitored, and having a power output, a reference voltage output, and a sensing voltage output.

4. A ranged voltage monitor as recited in claim 3 wherein said under-range sensing means includes an operational amplifier having an inverting input coupled to said reference voltage and having a non-inverting input coupled to said sensing voltage, and wherein said over-range sensing means and said mid-range sensing means each include and operational amplifier having an inverting input coupled to said sensing voltage and having a non-inverting input coupled to said reference voltage.

5. A ranged voltage monitor as recited in claim 4 wherein each of said indicators are coupled to respective ones of said operational amplifiers by a driving transistor, and wherein said disabling means is operative to bias said driving transistors to shut-off.

6. A ranged voltage monitor as recited in claim 5 wherein said disabling means includes a plurality of base bias switches, each base bias switch having a control lead and two input/output leads such that it is operative to switch on and off the base bias current of an associated mid-range driving transistor, and wherein the control lead of each of said base bias switches is coupled to a subsequent mid-range sensing means.

7. A ranged voltage monitor as recited in claim 6 wherein said disabling means further includes a plurality of rectifiers coupling the control leads of said base bias switches together.

8. A ranged voltage monitor as recited in claim 7 wherein said disabling means further includes a plurality of indicator sensing switches, each indicator sensing switch being operative to disable the base bias switch of a preceding stage when its associated indicator is actuated.

9. A ranged voltage monitor as recited in claim 1 wherein said enunciator produces a first audible tone for a first signal input, and a second audible tone for a second signal input.

10. A ranged voltage monitor as recited in claim 1 wherein said enunciator includes a pair of user selectable switches coupling the two signal inputs of said enunciator various ones of said output signals of said under-range sensing means, said over-range sensing means, and said mid-range sensing stage.

11. A ranged voltage monitor as recited in claim 1 wherein said enunciator includes a tone generator and a switching network, said switching network being responsive to said two signal inputs and operative to control the output characteristics of said tone generator.

* * * * *